(12) United States Patent
Cannon et al.

(10) Patent No.: US 7,719,887 B2
(45) Date of Patent: May 18, 2010

(54) CMOS STORAGE DEVICES CONFIGURABLE IN HIGH PERFORMANCE MODE OR RADIATION TOLERANT MODE

(75) Inventors: Ethan H. Cannon, Essex Junction, VT (US); Michael S. Gordon, Yorktown Heights, NY (US); Christopher D. LeBlanc, Montpelier, VT (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 11/845,170

(22) Filed: Aug. 27, 2007

(65) Prior Publication Data

US 2009/0059657 A1   Mar. 5, 2009

(51) Int. Cl.
*G11C 11/00* (2006.01)
(52) U.S. Cl. .................. 365/163; 365/148; 365/154
(58) Field of Classification Search .................. 365/154, 365/156, 113, 163, 148; 257/532, 536, 380, 257/382
See application file for complete search history.

(56) References Cited

U.S. PATENT DOCUMENTS

| | | | | |
|---|---|---|---|---|
| 4,805,148 A | * | 2/1989 | Diehl-Nagle et al. | 365/154 |
| 5,504,703 A | * | 4/1996 | Bansal | 365/156 |
| 5,905,290 A | * | 5/1999 | Houston | 257/380 |
| 6,111,780 A | * | 8/2000 | Bertin | 365/154 |
| 6,208,554 B1 | * | 3/2001 | Phan et al. | 365/154 |
| 6,369,630 B1 | * | 4/2002 | Rockett | 327/210 |
| 7,397,691 B2 | * | 7/2008 | Bhavnagarwala et al. | 365/154 |
| 7,486,541 B2 | * | 2/2009 | Liaw | 365/154 |
| 2004/0076051 A1 | | 4/2004 | Klein | |
| 2004/0188668 A1 | | 9/2004 | Hamann et al. | |
| 2005/0027409 A1 | | 2/2005 | Marshall et al. | |
| 2005/0036364 A1 | | 2/2005 | Ha et al. | |
| 2005/0127350 A1 | | 6/2005 | Furkay et al. | |
| 2005/0184282 A1 | | 8/2005 | Lai et al. | |
| 2007/0165446 A1 | * | 7/2007 | Oliva et al. | 365/154 |
| 2007/0181972 A1 | * | 8/2007 | Voldman | 257/532 |

\* cited by examiner

*Primary Examiner*—Gene N. Auduong
(74) *Attorney, Agent, or Firm*—Schmeiser, Olsen & Watts; Louis J. Percello

(57) ABSTRACT

A radiation tolerant circuit, structure of the circuit and method of autonomic radiation event device protection. The circuit includes a charge storage node connected to a resistor, the resistor comprising a material having an amorphous state and a crystalline state, the amorphous state having a higher resistance than the crystalline state, the material reversibly convertible between the amorphous state and the crystalline state by application of heat; an optional resistive heating element proximate to the resistor; and means for writing data to the charge storage node and means for reading data from the charge storage node.

25 Claims, 10 Drawing Sheets

CMOS STORAGE DEVICES CONFIGURABLE IN HIGH PERFORMANCE MODE OR RADIATION TOLERANT MODE

FIELD OF THE INVENTION

The present invention relates to the field of integrated circuits; more specifically, it relates to integrated circuits having high performance modes and radiation tolerant modes.

BACKGROUND OF THE INVENTION

Soft-errors in integrated circuits are caused by ionizing radiation striking, for example, the silicon regions of field effect transistors in memory cells or latches and changing the charge level stored in the cell or latch causing a flip in state of the cell or latch and thus generating an error. The error state is removed the next time data is written into the cell or latch. In order to protect sensitive integrated circuits various radiation tolerant structures and circuit designs have been developed. However conventional radiation tolerant integrated circuits have had to pay performance penalties. The very methods and design features that cause the integrated circuit to be radiation tolerant also very significantly slow the radiation tolerant integrated circuit down. Accordingly, there exists a need for radiation tolerant integrated circuits having minimized circuit performance degradation.

SUMMARY OF THE INVENTION

A first aspect of the present invention is a circuit, comprising: a charge storage node connected to a resistor, the resistor comprising a material having an amorphous state and a crystalline state, the amorphous state having a higher resistance than the crystalline state, the material reversibly convertible between the amorphous state and the crystalline state by application of heat; means for applying sufficient heat to the resistor to (i) change the amorphous state of the resistor to the crystalline state and to (ii) change the crystalline state of the resistor to the amorphous state; and means for writing data to the charge storage node and means for reading data from the charge storage node.

A second aspect of the present invention is a method of autonomic protection of an electronic device from soft error upset, comprising: providing a circuit comprising: a charge storage node connected to a resistor, the resistor comprising a material having an amorphous state and a crystalline state, the amorphous state having a higher resistance than the crystalline state, the material reversibly convertible between the amorphous state and the crystalline state by application of heat; means for applying sufficient heat to the resistor to (i) change the amorphous state of the resistor to the crystalline state and to (ii) change the crystalline state of the resistor to the amorphous state; means for writing data to the charge storage node and means for reading data from the charge storage node; and a radiation detector; and either (i) upon the radiation detector detecting radiation, increasing the resistance of the resistor by changing a physical state of the resistor from a crystalline state to the amorphous state and after a preset duration of time has passed without the radiation detector detecting radiation or detecting less than a preset number of radiation events in the preset duration of time, decreasing the resistance of the resistor by changing the resistor from the amorphous state to the crystalline state or (ii) upon the radiation detector detecting radiation, decreasing the resistance of the resistor by changing the physical state of the resistor from the amorphous state to the crystalline state and after the preset duration of time has passed without the radiation detector detecting radiation or detecting less than a preset number of radiation events in the preset duration of time, increasing the resistance of the resistor by changing the resistor from the crystalline state to the amorphous state.

A third aspect of the present invention is a structure, comprising: a charge storage node formed in a substrate, the charge storage node connected to a resistor, the resistor comprising a material having an amorphous state and a crystalline state, the amorphous state having a higher resistance than the crystalline state, the material reversibly convertible between the amorphous state and the crystalline state by application of heat; and means for applying sufficient heat to the resistor to (i) change the amorphous state of the resistor to the crystalline state and to (ii) change the crystalline state of the resistor to the amorphous state.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Soft-error rates in integrated circuits are caused by ionizing radiation, such as alpha particles passing through the semiconductor materials (e.g., silicon) of the integrated circuit. Both logic and memory circuits may be effected. The errors are called "soft" because they generally only persist until the next cycle of the integrated circuit function. As an alpha particle passes through semiconductor material (e.g., silicon) a "cloud" of electron-hole pairs is generated in the vicinity of its path. Electric fields present in the integrated circuit can cause the holes and electrons to migrate in opposite directions thus causing extra charge to reach particular circuit nodes and change the charge on those nodes.

By slowing down a circuit, the effect of the extra charge can be minimized because it will take longer for the effect of the extra charge to propagate from the charge storage node to the cross-coupled node in the circuit and the circuit has more time to restore the charge storage node to its initial state. The present invention utilizes a variable resistance resistor in the circuit path that includes a location where charge is generated by a radiation event (e.g., a source or drain of a field effect transistor and/or a charge storage node). The charge generation location may also be the charge storage node. The resistance of the variable resistor is controllable (i.e., configurable) during operation of the circuit. When the resistor has a high resistance, the circuit is slower but more tolerant of radiation events. When the resistor has a low resistance, the circuit is faster but less tolerant of radiation events.

Figure 1:
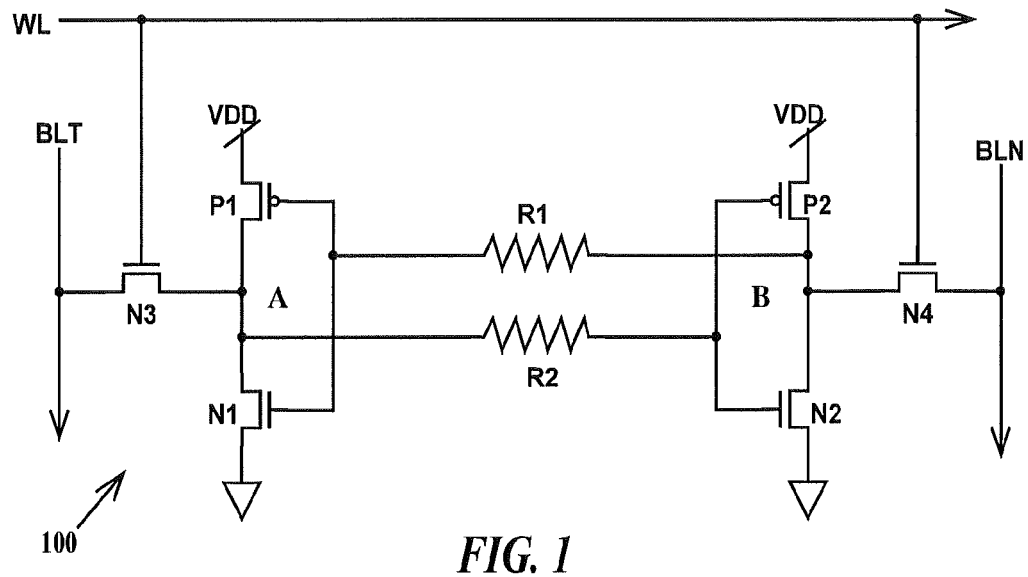
FIG. 1 is a circuit diagram of a first exemplary SRAM cell according to embodiments of the present invention.

FIG. 1 is a circuit diagram of a first exemplary static random access memory (SRAM) cell according to embodiments of the present invention. In FIG. 1, SRAM cell 100 includes PFETs P1 and P2 and NFETs N1, N2, N3 and N4. PFET P1 and NFET N1 form a first inverter and PFET P2 and NFET N2 form a second inverter. The first and second inverters are cross-coupled. NFETs N3 and N4 are pass gate devices. The sources of PFETs P1 and P2 are connected to VDD. The sources of NFETs N1 and N2 are connected to ground. The source of NFET N3 is connected to a bitline true line BLT and source of NFET N4 is connected to a bitline not line BLN. The drains of PFET P1 and NFETs N1 and N3 are connected at a node A. The drains of PFET P2 and NFETs N2 and N4 are connected at a node B. The connections of the source/drains of NFETs N3 and N4 may be reversed. The gates of NFETs N3 and N4 are connected to a wordline WL. The gates of PFET P1 and NFET N1 are coupled to node B through resistor R1 and the gates of PFET P2 and NFET N2 are coupled to node A through resistor R2.

Figure 2:
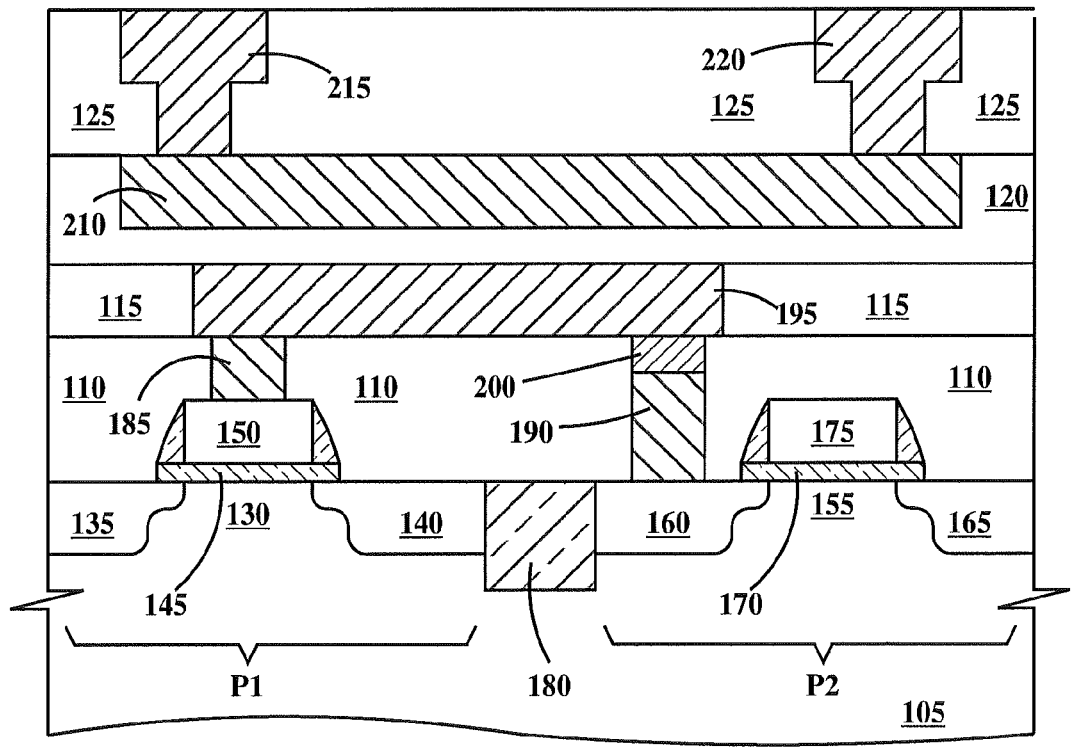
FIG. 2 is a cross-section view illustrating a first exemplary physical structure of a portion of the SRAM cell of FIG. 1.

FIG. 2 is a cross-section view illustrating a first exemplary physical structure of a portion of the SRAM cell of FIG. 1. It should be understood that the physical wiring illustrated in FIG. 2 is only one of very many different physical wiring schemes that are possible and any particular wiring scheme is dependent on the layout of the SRAM cell and the technology used to fabricate the SRAM. In FIG. 2, formed on a top surface of silicon substrate 105 is a dielectric passivation layer 110. Formed on a top surface of passivation layer 110 is a first interlevel dielectric layer (ILD) 115. Formed on a top surface of ILD layer 115 is a transitional dielectric layer 120. Formed on a top surface of transitional dielectric layer 120 is a second ILD layer 125.

PFET P1 includes a channel region 130 between a source 135 and a drain 140 formed in substrate 105, a gate dielectric layer 145 formed over channel region 130 and a gate 150 formed over gate dielectric layer 130. PFET P2 includes a channel region 155 between a drain 160 and a source 165 formed in substrate 105, a gate dielectric layer 170 formed over channel region 155 and a gate 175 formed over gate dielectric layer 170. Formed in passivation layer 110 is an electrically conductive contact 185 to gate 150 and an electrically conductive contact 190 to drain 160. An electrically conductive wire 195 is formed in first ILD layer 115. A resistor 200 is formed in passivation layer 110 between contact 190 and wire 195. Wire 195 physically and electrically contacts contact 185 and resistor 200. Relative to FIG. 1, resistor 200 is resistor R1 of FIG. 1 and drain 160 is electrically part of node B of FIG. 1. Formed in transitional dielectric layer 120 is a resistive heating element 210. Opposite ends of heating element 210 are electrically connected to wires 215 and 220 formed in second ILD layer 125. It should be understood that there can be many additional ILD layers, each containing wires, above second ILD layer 125, in completed integrated circuit chips.

Contacts 185 and 190, resistor 200, wire 195 and heating element 210 are damascene contacts and wires formed by a damascene process. Wires 215 and 220 are dual-damascene wires formed by a dual-damascene process. Alternatively, any or all of contacts 185 and 190, resistor 200, wire 195, heating element 210 and wires 215 and 220 may be formed by other processes known in the art, such as subtractive etching of electrically conductive layers (e.g., metal layers).

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

In a first example, resistor 200 comprises a chalcogenide material having a low electrical resistivity in a crystalline state and a high resistivity in an amorphous state where the state can be changed by applying heat to the resistor. A chalcogenide material is defined as a binary chemical compound of a chalcogen and a more electropositive element. A chalcogen is defined as any periodic table group 16 (i.e., group VIB or VIA) element. Those elements are oxygen (O), sulfur (S), selenium (Se), tellurium (Te) and polonium (Po). In one example, resistor 200 comprises the chalcogenide $Sb_2Te$ In a second example, resistor 200 comprises a chalcogenide-like (i.e., need not be binary compound, but contains a chalcogen) a material having a low electrical resistivity in a crystalline state and a high resistivity in an amorphous state where the state can be changed by applying heat to the resistor. In one example resistor 200 comprises the chalcogenide-like GeSbTe.

In a third example, resistor 200 comprises a germanium (Ge) or antimony (Sb) compound having a low electrical resistivity in a crystalline state and a high resistivity in an amorphous state where the state can be changed by applying heat to the resistor. In one example resistor 200 comprises GeSb.

One method for forming resistor 200 includes (1) forming contact 190 so it extends to the top surface of passivation layer 110, etching out an upper region of contact 190 so it now appears as illustrated in FIG. 1, and (3) sputter deposition or spin application of the resistive material to fill the space created by etching back the contact.

For Ge and Sb based materials the crystallization temperature is less than about 200° C. and the melting temperature is about 300° C., the resistivity in the crystalline state is between about 0.001 Ohm-cm and about 0.01 Ohm-cm and the resistivity in the amorphous state is between about 10 Ohm-cm and about 100 Ohm-cm.

As deposited resistor 200 (or resistive layer 222, see FIG. 11) is in the amorphous, high resistance state. A change from a crystalline state to an amorphous, high resistance state requires faster heating and cooling than a change from an amorphous state to a crystalline, low resistance state. However, in one example, ramp up and ramp down temperature rates are measured in units of $10^{11}$° C./sec for both. Such quick ramp rates may be accomplished by spiking the current flowing through heaters adjacent to the resistive element or through the resistive element itself. In one example, for Ge and Sb based material resistive elements, a change from the amorphous state to the crystalline state requires heating the resistive element to about 150° C. while a change from the crystalline state to the amorphous state requires heating the resistive element to about 300° C.

Examples of suitable materials for resistive heating element 210 include, but are no limited to tungsten (W), tungsten nitride (WN), tantalum (Ta), tantalum nitride (TaN), molybdenum (Mo), chromium (Cr), titanium nitride (TiN), tantalum silicon nitride (TaSiN), titanium silicon nitride (TiSiN), tungsten silicon nitride (WSiN), polysilicon, and combinations thereof.

Figure 3:
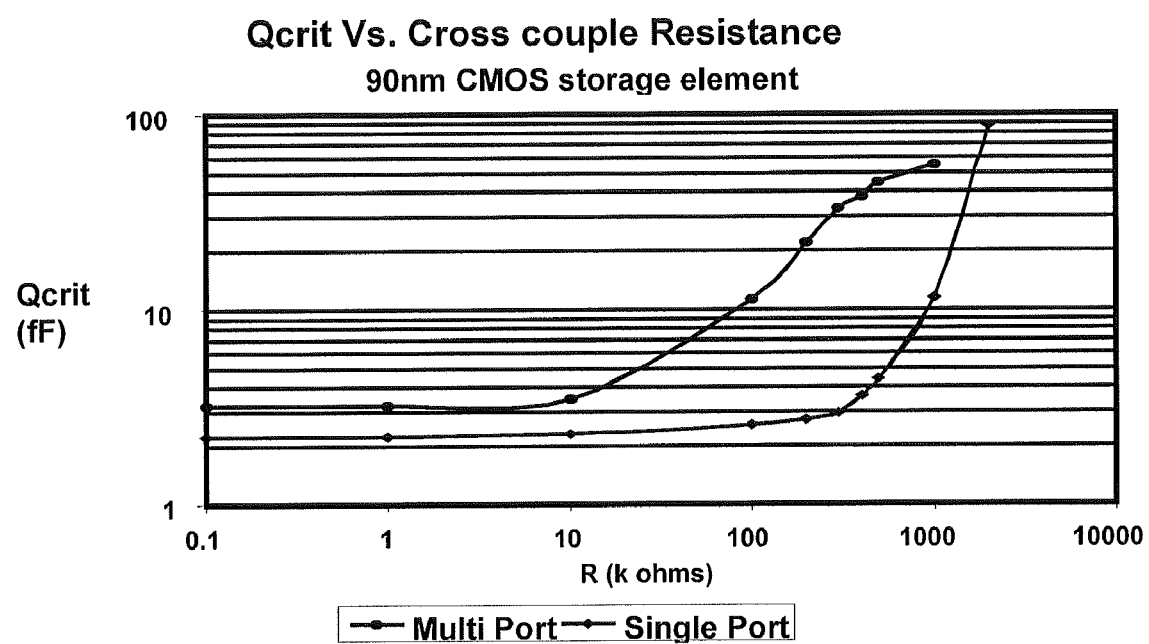
FIG. 3 is a plot of Qcrit versus Resistance values for the SRAM cells of FIGS. 3 and 8.
Figure 8:
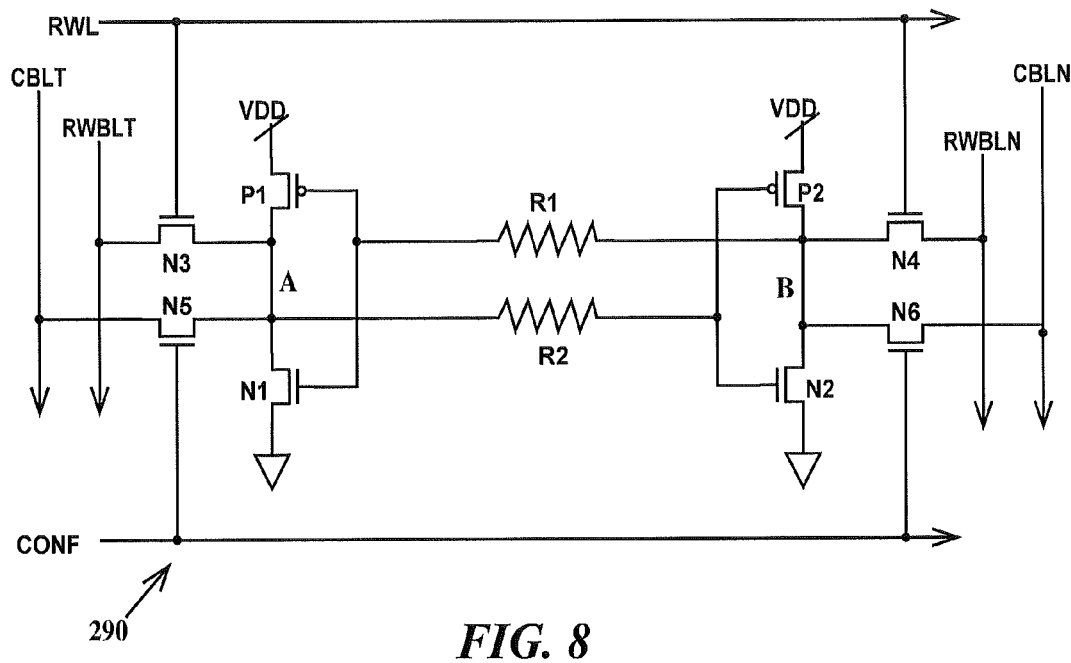
FIG. 8 is a circuit diagram of a fourth exemplary SRAM cell according to embodiments of the present invention.

FIG. 3 is a plot of Qcrit versus Resistance values for the SRAM cells of FIGS. 1 and 8. The charge required to upset the state of the charge storage node (Qcrit) of the SRAM cell of FIG. 1 as a function of the R1 and R2 resistance is illustrated by the lower curve (diamonds) of FIG. 3. In the high performance state the resistance of R1 and R2 are about 0.1 ohm and Qcrit is about 2 fC. In the radiation tolerant state the resistance of R1 and R2 are about 1 Mohm and Qcrit is about 10 fC. Since the single event upset (SEU) rate (SER) is an exponential function of Qcrit, the SER is greatly reduced when the R1 and R2 resistors are in their high resistance state.

Figure 4:
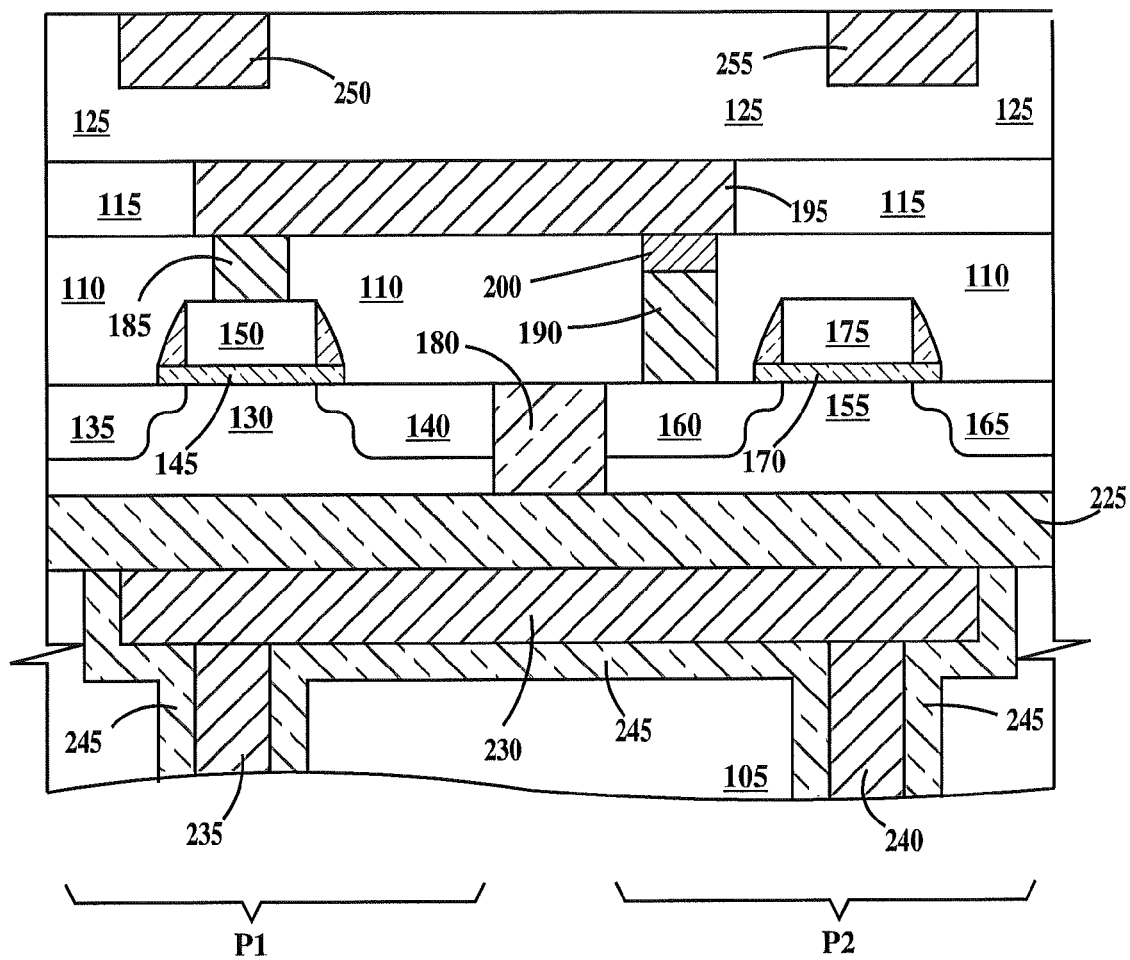
FIG. 4 is a cross-section view illustrating a second exemplary physical structure of a portion of the SRAM cell of FIG. 1.

FIG. 4 is a cross-section view illustrating a second exemplary physical structure of a portion of the SRAM cell of FIG. 1. FIG. 4, is similar to FIG. 2 except substrate 105 includes a buried oxide layer (BOX) 225, a resistive heating element 230 replaces resistive heating element 210 of FIG. 2 and resistive heating element 230 has been formed in substrate 105 abutting BOX 225 on the opposite side of BOX 225 from transistors P1 and P2. Suitable materials for resistive heating element 230 include all of the materials described supra for resistive heating element 210 of FIG. 2. Resistive heating element 230 is contacted through electrically conductive contacts 235 and 240. Resistive heating element 230 and contacts 235 and 240 are electrically isolated from substrate 105 by a dielectric layer 245.

Figure 5:
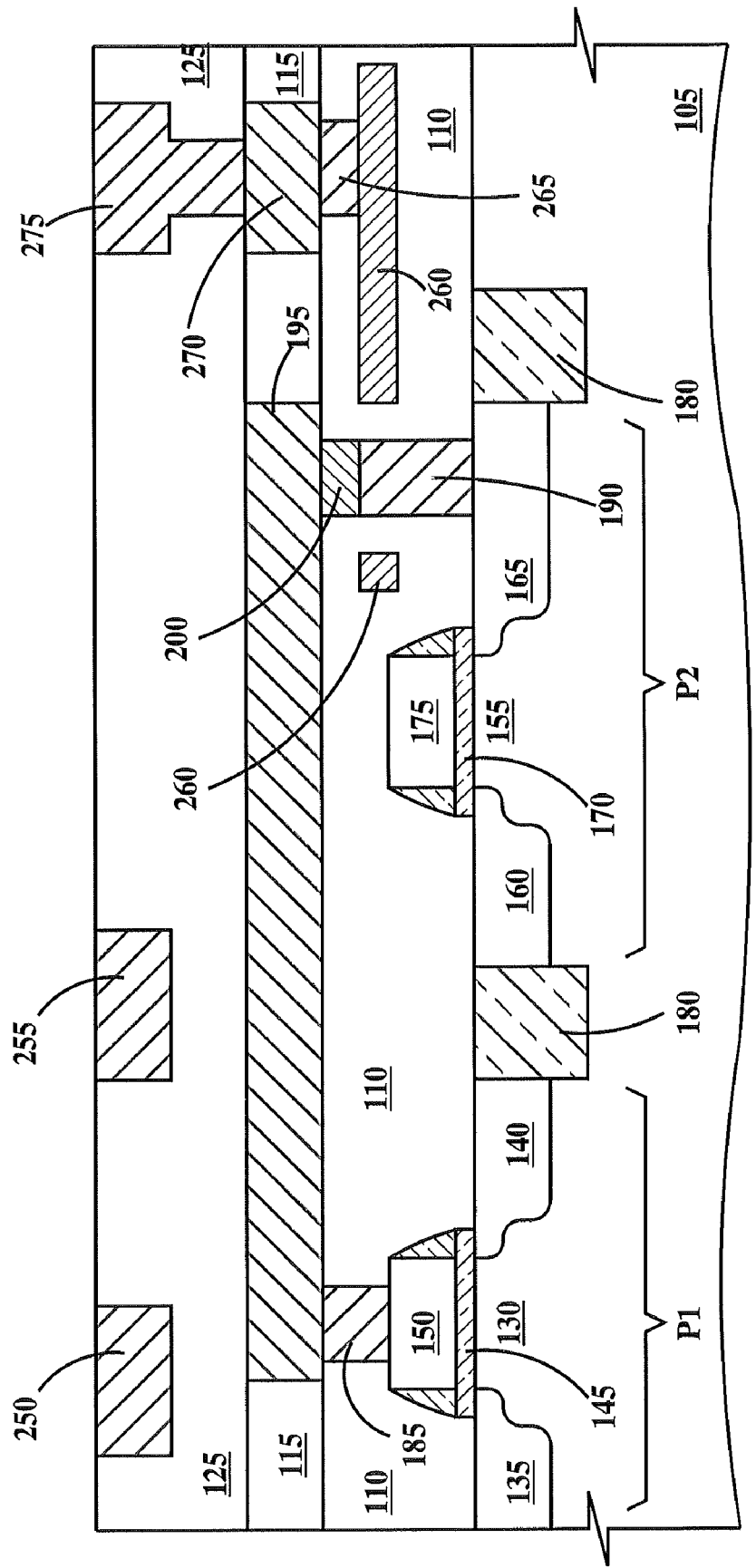
FIG. 5 is a cross-section view illustrating a third exemplary physical structure of a portion of the SRAM cell of FIG. 1.

FIG. 5 is a cross-section view illustrating a third exemplary physical structure of a portion of the SRAM cell of FIG. 1. FIG. 5 is similar to FIG. 2 except a resistive heating element 260 in dielectric passivation layer 110 replaces resistive heating element 210 of FIG. 2. When viewed from above, resistive heating element 260 has the shape of the letter "C" with resistor 200 in the middle of the "C." Resistive heating element 260 is contacted by two sets (only one set shown) of electrically conductive contacts/wires 265, 270 and 275, one on each horn of the letter "C". Suitable materials for resistive heating element 260 include all of the materials described supra for resistive heating element 210 of FIG. 2.

Figure 6:
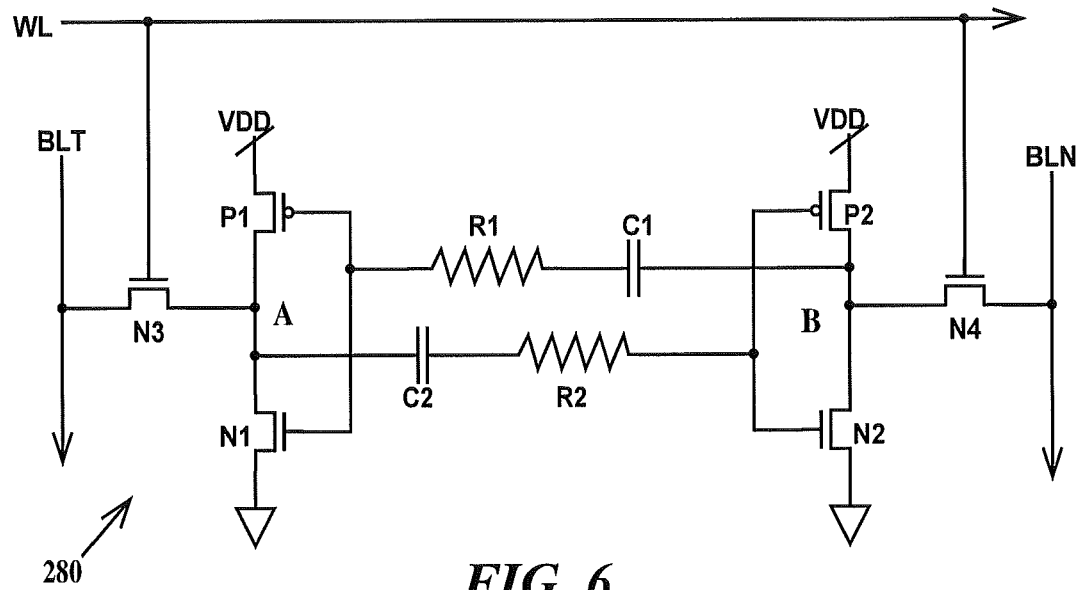
FIG. 6 is a circuit diagram of a second exemplary SRAM cell according to embodiments of the present invention.

FIG. 6 is a circuit diagram of a second exemplary SRAM cell according to embodiments of the present invention. In FIG. 6, an SRAM cell 280 is similar to SRAM cell 100 of FIG. 1, except a capacitor C1 is connected in series between resistor R1 and node B and a capacitor C2 is connected in series between resistor R2 and node A. The positions of resistor R1 and capacitor C1 relative to node B may be swapped. The positions of resistor R2 and capacitor C2 relative to node A may be swapped. Capacitors C1 and C2 impart additional radiation tolerance to SRAM cell 280.

Figure 7:
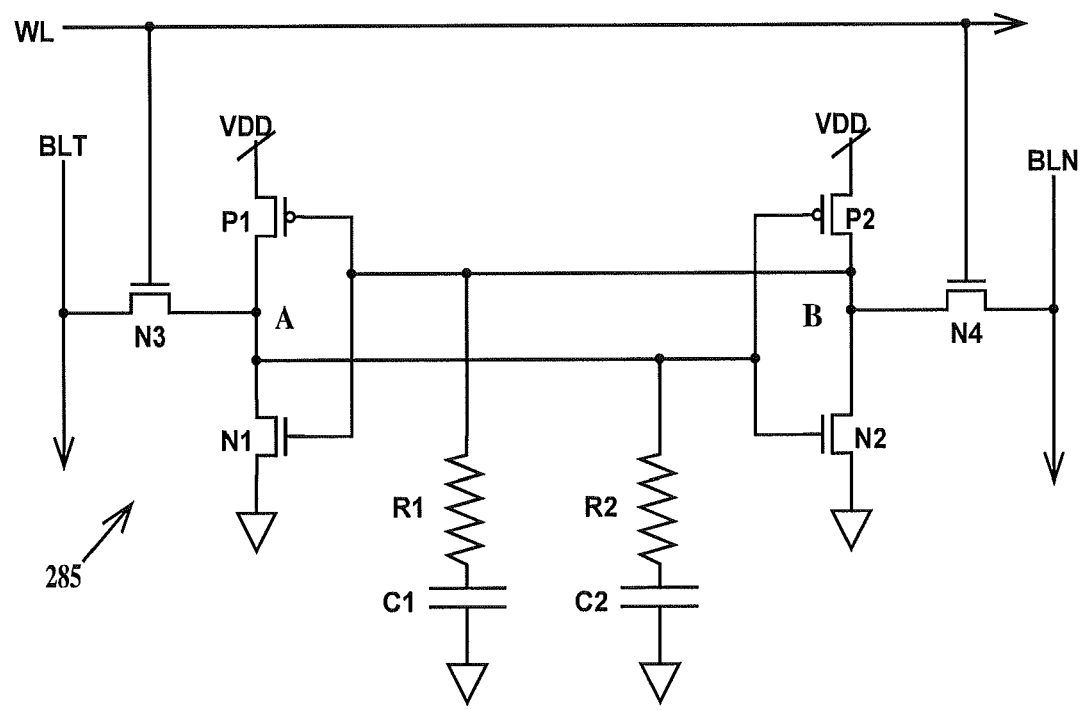
FIG. 7 is a circuit diagram of a third exemplary SRAM cell according to embodiments of the present invention.

FIG. 7 is a circuit diagram of a third exemplary SRAM cell according to embodiments of the present invention. In FIG. 7, an SRAM cell 285 is similar to SRAM circuit 100 of FIG. 1, except resistor R1 and a capacitor C1 are connected in series between node A and ground and resistor R1 and a capacitor C2 are connected in series between node B and ground. Capacitors C1 and C2 impart additional radiation tolerance to SRAM cell 285. In contrast to the exemplary SRAM cells in FIGS. 1 and 6, the exemplary SRAM cell in FIG. 7 has higher performance when the resistors R1 and R2 are in the high resistance state because the capacitors C1 and C2 are effectively decoupled from nodes B and A.

FIG. 8 is a circuit diagram of a fourth exemplary SRAM cell according to embodiments of the present invention. In FIG. 8, a dual port SRAM cell 290 is similar to SRAM circuit 100 of FIG. 1, except additional pass gates (NFETs) N5 and N6 are connected to nodes A and B respectively, the gates of NFETS N3 and N4 are connected to a read/write access line RWL, the gates of NFETs N5 and N6 are connected to configuration control line CONF, the source of NFET N3 is connected to a read/write bitline true (RWBLT), the source of NFET N4 is connected to a read/write bitline not (RWBLN), the source of NFET N5 is connected to a configuration bitline true (CBLT) and the source of NFET N5 is connected to a configuration bitline not (CBLN).

Returning to FIG. 3, the charge required to upset the state of the charge storage node (Qcrit) of SRAM cell 290 of FIG. 8 as a function of the R1 and R2 resistance is illustrated by the upper curve (circles) of FIG. 3. In the high performance state the resistance of R1 and R2 are about 0.1 ohm and Qcrit is about 3 fC. In the radiation tolerant state the resistance of R1 and R2 are about 1 Mohm and Qcrit is about 30 fC.

Figure 9:
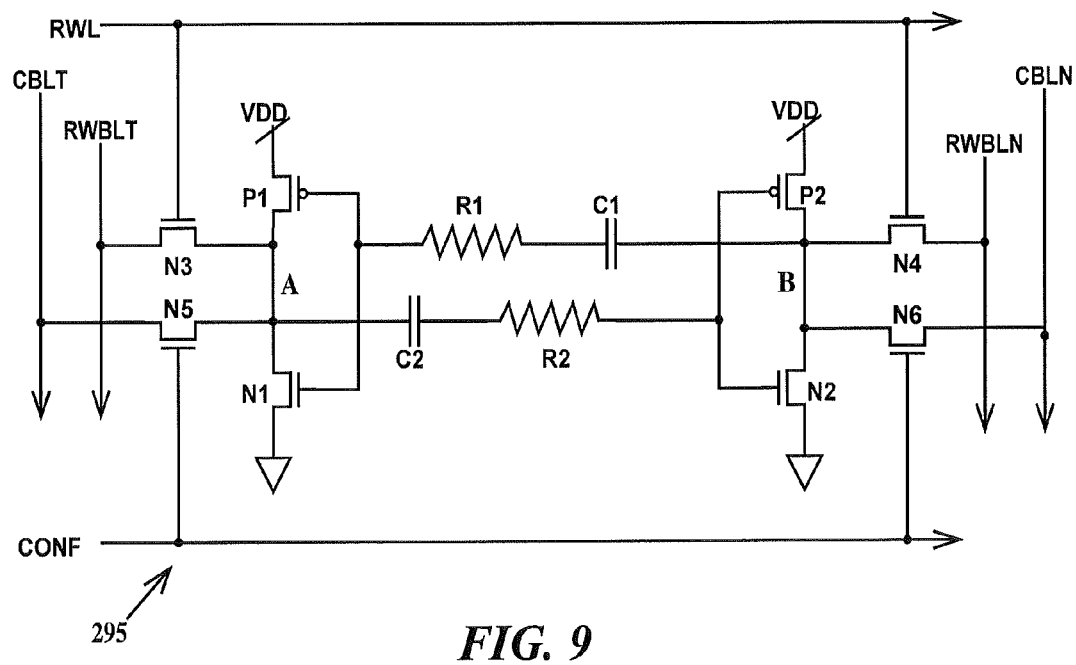
FIG. 9 is a circuit diagram of a fifth exemplary SRAM cell according to embodiments of the present invention.

FIG. 9 is a circuit diagram of a fourth exemplary SRAM cell according to embodiments of the present invention. In FIG. 9, an SRAM cell 295 is similar to SRAM cell 290 of FIG. 8 except a capacitor C1 is connected in series between resistor R1 and node B and a capacitor C2 is connected in series between resistor R2 and node A. The positions of resistor R1 and capacitor C1 relative to node B may be swapped. The positions of resistor R2 and capacitor C2 relative to node A may be swapped. Capacitors C1 and C2 impart additional radiation tolerance to SRAM cell 295.

Figure 10:
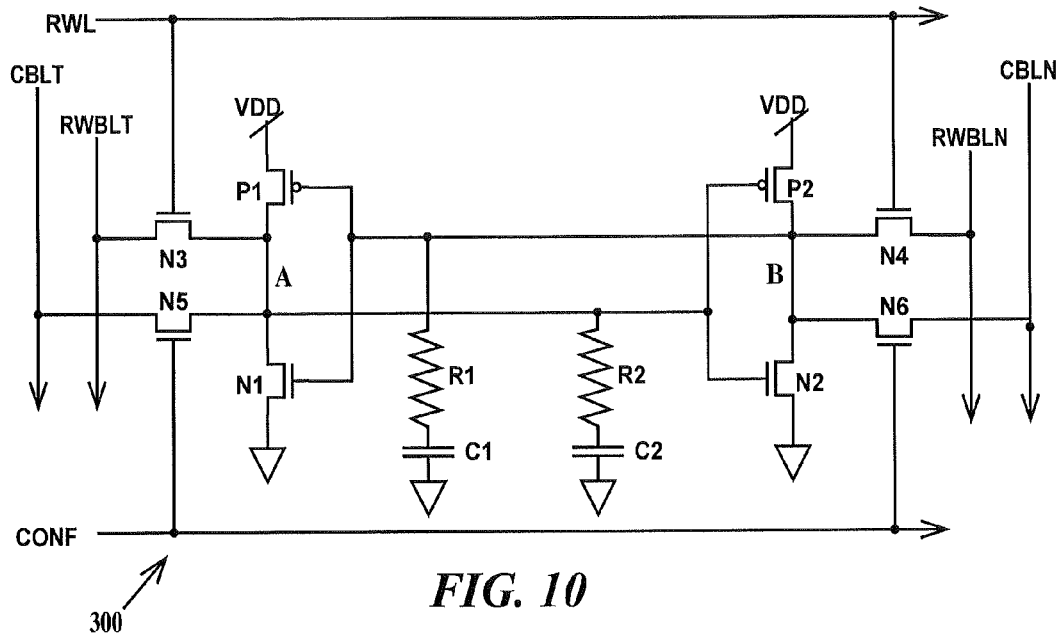
FIG. 10 is a circuit diagram of a sixth exemplary SRAM cell according to embodiments of the present invention.

FIG. 10 is a circuit diagram of a fifth exemplary SRAM cell according to embodiments of the present invention. In FIG. 10, an SRAM cell 300 is similar to SRAM circuit 290 of FIG. 8, except resistor R1 and a capacitor C1 are connected in series between node A and ground and resistor R1 and a capacitor C2 are connected in series between node B and ground. Capacitors C1 and C2 impart additional radiation tolerance to SRAM cell 300. In contrast to the exemplary SRAM cells in FIGS. 8 and 9, the exemplary SRAM cell in FIG. 10 has higher performance when the resistors R1 and R2 are in the high resistance state because the capacitors C1 and C2 are effectively decoupled from nodes B and A.

Figure 11:
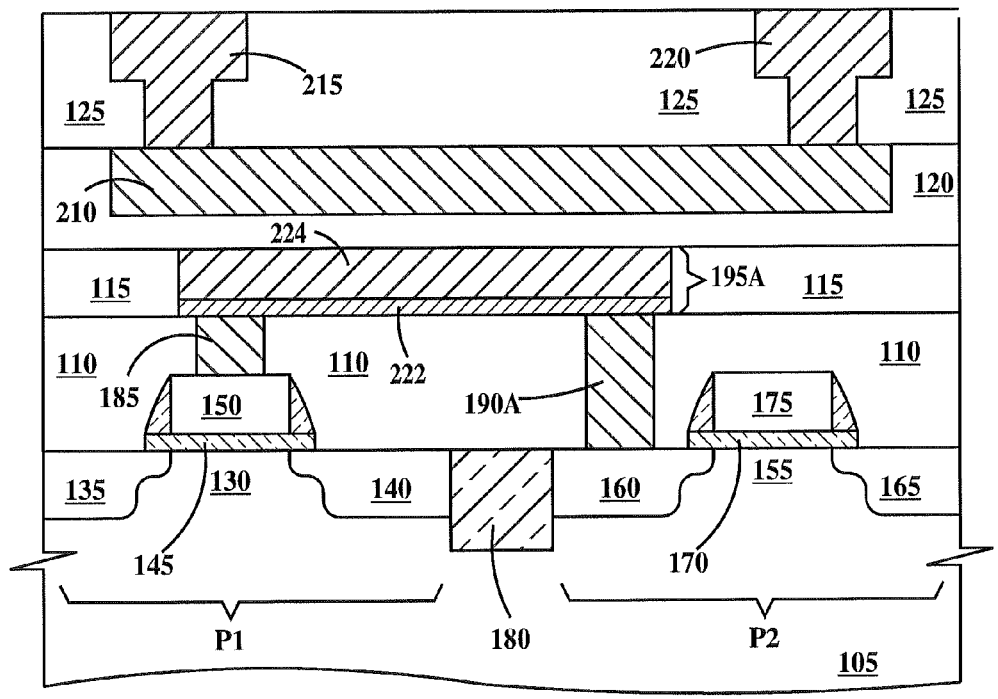
FIG. 11 illustrates an alternative variable resistor structure.

FIG. 11 illustrates an alternative variable resistor structure. In FIG. 1, a wire 195A includes a resistive layer 222 of the resistive material described supra for resistor 200 (see FIG. 2) formed first and an overlying layer 224 of a low resistance conductor such as aluminum (Al) or copper (Cu) formed second. A contact 190A electrically connects resistive layer 222 to drain 160. Resistive layer 222 may replace resistor 200 in the embodiments described supra and illustrated in FIGS. 2, 4, and 5. In one example, resistive layer 222 and conductive layer 224 of wire 195A are formed by a damascene process. Alternatively, heater 210 may be replaced by an in substrate heater such as resistive heating element 230 of FIG. 4.

Figure 12:
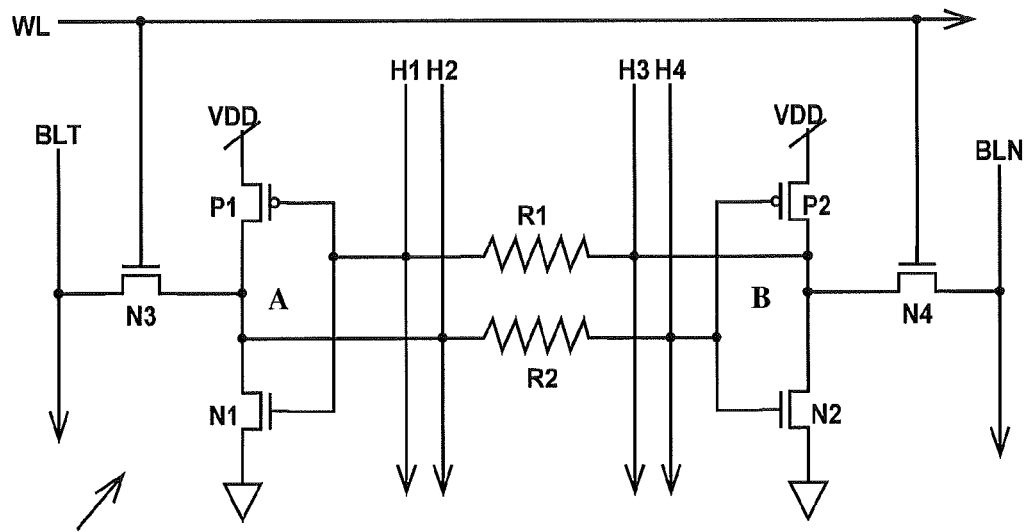
FIG. 12 is a circuit diagram of a seventh exemplary SRAM cell according to embodiments of the present invention.

FIG. 12 is a circuit diagram of a seventh exemplary SRAM cell according to embodiments of the present invention. In FIG. 12, an SRAM cell 305 is similar to SRAM cell 100 of FIG. 1 except for the addition of high current supply lines H1, H2, H3 and H4. Resistor R1 is connected between lines H1 and H3 and resistor R2 is connected between lines H2 and H4. In one example, supply lines H1, H2, H3 and H4 are connected to a current source capable of supplying a current of between about 1 milliamp and about 10 milliamps. In a first example, heat is generated in the wires connected to resistors R1 and R2 by current flow through those wires, heating up resistor R1 and changing the crystalline state and resistance of resistors R1 and R2 as described supra. In a second example, heat is generated in resistors R1 and R2 themselves by current flow through resistors R1 and R2 and changing the crystalline state and resistance of resistors R1 and R2 as described supra. In these two examples, no separate heater (e.g., resistive heating element 210 of FIG. 1) are required. In a third example, heaters may be formed in series and in physical contact with resistors R1 and R2 (see, for example, FIG. 15), so current flowing through these heaters cause the heaters to heat up, in turn heating resistors R1 and R2 and changing the crystalline state and resistance of resistors R1 and R2 as described supra. This approach (i.e., described in FIG. 12) of using separate high current lines may be applied to SRAM cells 280 of FIG. 6, 290 of FIG. 8, and 295 of FIG. 9.

Figure 13:
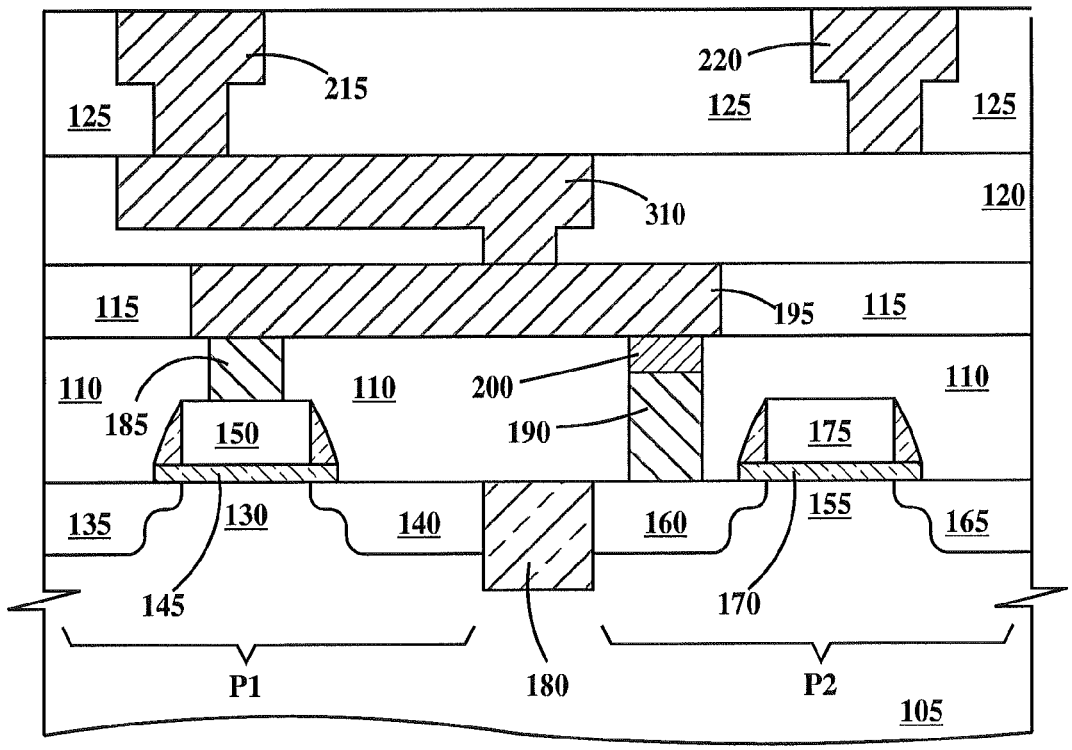
FIG. 13 is a cross-section view illustrating an exemplary physical structure of a portion of an SRAM cell suitable for use in the circuit of FIG. 12 (or FIG. 14)

FIG. 13 is a cross-section view illustrating an exemplary physical structure of a portion of an SRAM cell suitable for use in the circuit of FIG. 12. The use of heater lines is advantageously applied to the exemplary physical structures described supra, where the resistive element is formed in a via or contact opening. In FIG. 13, heater 210 of FIG. 2 is replaced with a wire 310 connected between wires 215 and 195. Wire 215 may be connected to line H1 of FIG. 12. Another set of wires (not shown) would be connected to contact 190. When current is passed through wire 195, resistor 200 and contact 190, resistor 200 will heat up.

Figure 14:
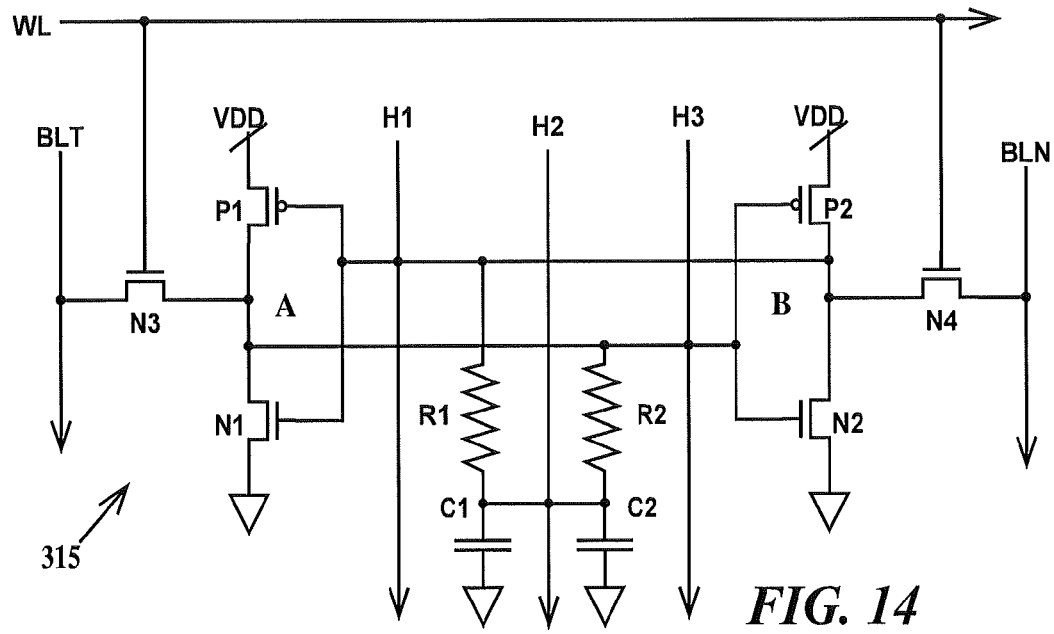
FIG. 14 is a circuit diagram of an eighth exemplary SRAM cell according to embodiments of the present invention.

FIG. 14 is a circuit diagram of an eighth exemplary SRAM cell according to embodiments of the present invention. In FIG. 14, an SRAM cell 315 is similar to SRAM cell 285 of FIG. 7, except for high current lines H1, H2 and H3. Resistor R1 is connected between lines H1 and H2 and resistor R2 is connected between lines H2 and H3. Line H2 is connected between resistor R1 and capacitor C1 and between resistor R2 and capacitor C2. It is advantageous that line H2 be connected to ground when it is desired to heat resistors R1 and R2. This approach (i.e., described in FIG. 14) of using separate high current lines may be applied to SRAM cells 285 of FIG. 7, and 300 of FIG. 10.

Figure 15:
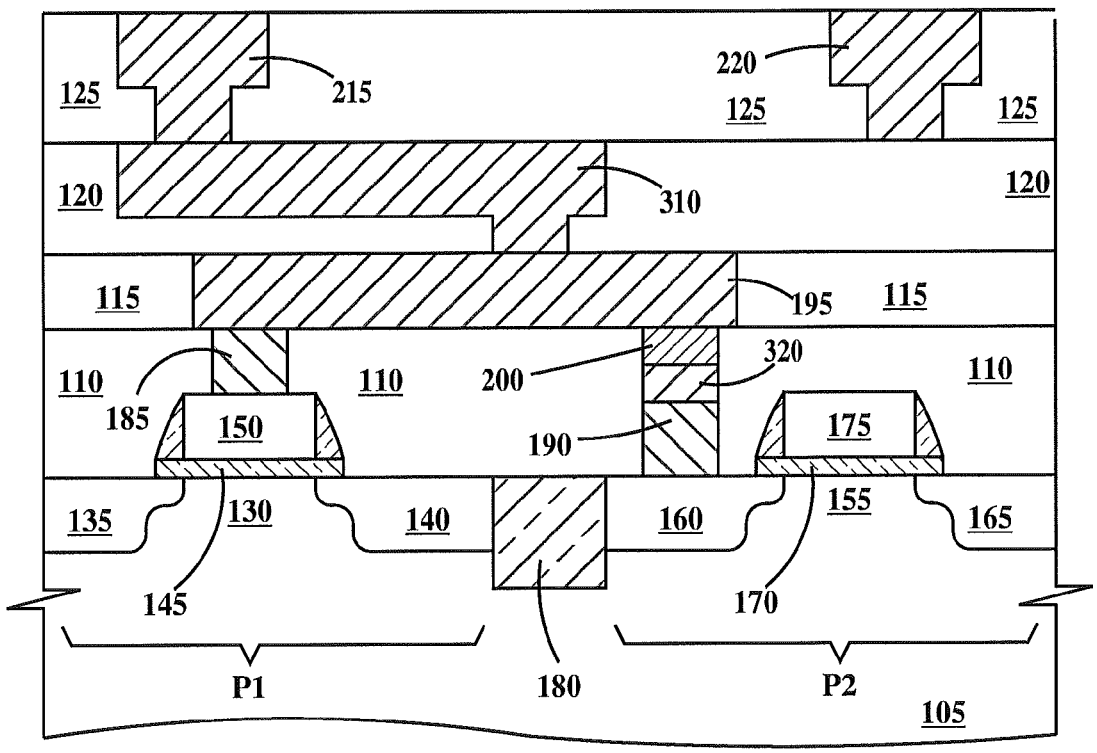
FIG. 15 is a cross-section view illustrating an exemplary physical structure of a portion of an SRAM cell suitable for use in the circuit of FIG. 14 (or FIG. 12)

FIG. 15 is a cross-section view illustrating an exemplary physical structure of a portion of an SRAM cell suitable for use in the circuit of FIG. 12. FIG. 15 is similar to FIG. 13 except a resistive heating element 320 has been formed between resistor 200 and contact 190 in the contact opening. Resistive heating element 320 may be formed from any of the material described supra for resistive heating element 210 of FIG. 1.

Figure 16A:
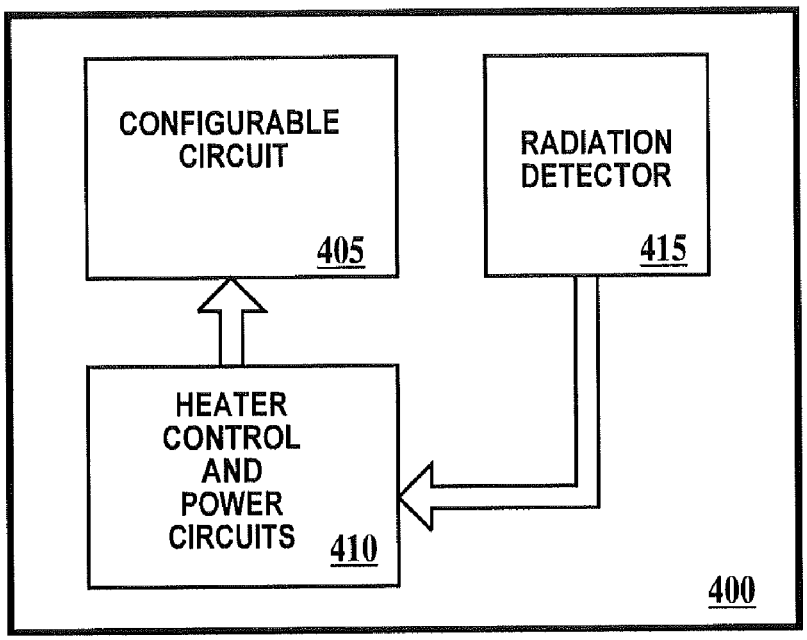
FIG. 16A is a schematic diagram of a first implementation integrated circuit chip according to embodiments of the present invention.

FIG. 16A is a schematic diagram of a first implementation integrated circuit chip according to embodiments of the present invention. In FIG. 16A, an integrated circuit chip 400 includes a configurable circuit 405, heater control and power circuits 410 and a radiation detector 415. In one example, configurable circuit 405 is any of circuits 100, 280, 285, 290, 295, 300, 305 or 315 having configurable variable resistors R1 and R2 illustrated in FIGS. 1, 6, 7, 8, 9, 10, 12 and 14 respectively and described supra. In one example, configurable circuit 405 is any circuit including a resistive element whose crystalline structure may reversibly changed by application of heat, which also changes the resistance of the resistive element. In one example, radiation detector 415 is an SRAM array having an electronic error correction circuit that monitors soft-error upset rates in the SRAM array.

In operation, upon detection of an ionizing radiation event (e.g. an alpha particle strike) by radiation detector 415, heater control and power circuits 410 change the resistance of the variable resistor(s) in configurable circuit 405 from a low resistance state to a high resistance state as described supra if the configurable circuit 405 comprises the exemplary SRAM cells of FIG. 1, 6, 8, 9 or 12. After a preset amount of time passing without any further ionizing radiation events occurring (or after a preset number of radiation events being detected in the preset duration of time), heater control and power circuits 410 change the resistance of the variable resistor(s) in configurable circuit 405 from the high resistance state to the low resistance state. The exemplary SRAM cells of FIG. 1, 6, 8, 9 or 12 operate faster in the low resistance (and high performance) state than in the high resistance (and radiation tolerant) state.

In operation, upon detection of an ionizing radiation event (e.g. an alpha particle strike) by radiation detector 415, heater control and power circuits 410 change the resistance of the variable resistor(s) in configurable circuit 405 from a high resistance state to a low resistance state as described supra if the configurable circuit 405 comprises the exemplary SRAM cells of FIG. 7, 10 or 14. Heater control and power circuits 410 include the high current power source required by SRAM cell 305 of FIG. 12 and SRAM cell 315 of FIG. 14. After a preset amount of time passing without any further ionizing radiation events occurring (or after a preset number of radiation events being detected in the preset duration of time), heater control and power circuits 410 change the resistance of the variable resistor(s) in configurable circuit 405 from the low resistance state to the high resistance state. The exemplary SRAM cells of FIG. 7, 10 or 14 operate faster in the high resistance (and high performance) state than in the low resistance (and radiation tolerant) state.

Figure 16B:
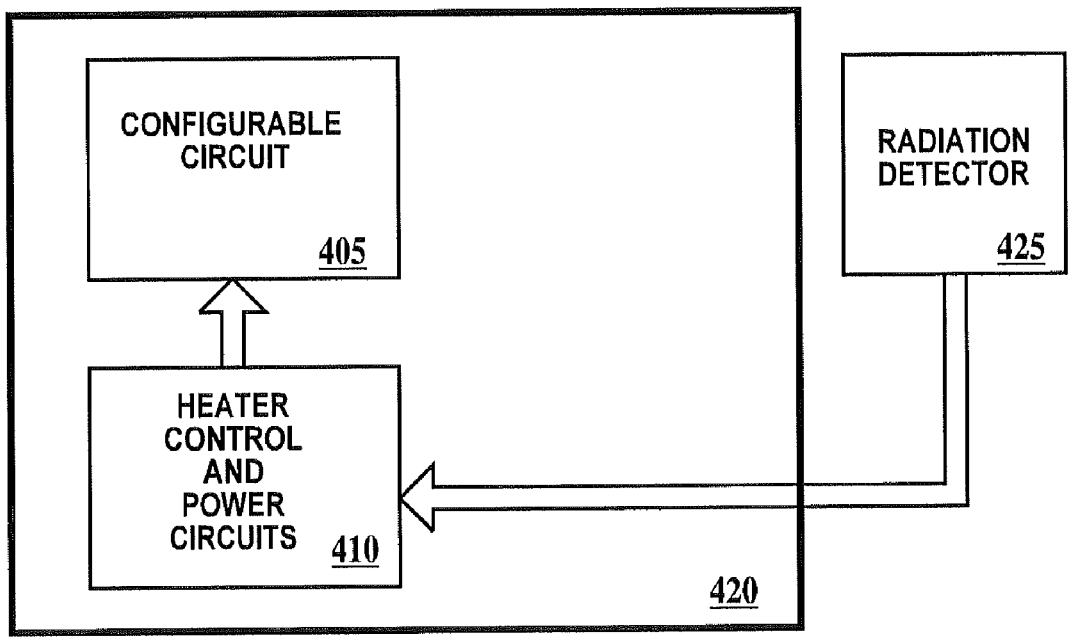
FIG. 16B is a schematic diagram of a second implementation integrated circuit chip according to embodiments of the present invention.

FIG. 16B is a schematic diagram of a second implementation integrated circuit chip according to embodiments of the present invention. In FIG. 16B, an integrated circuit chip 420 is similar to integrated circuit chip 400 of FIG. 16A, except heater control and power circuits 410 is connected to an off-chip radiation detector 425.

Thus, the embodiments of the present invention provide radiation tolerant integrated circuits having minimized circuit performance degradation.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, SRAM cells are one example of devices containing charge storage nodes that may be connected to a variable resistance as described supra. Other examples include dynamic random access memory cells, registers, latches and flip-flops. Therefore, it is intended that the following claims cover all such modifications and changes as fall within the true spirit and scope of the invention.

What is claimed is:

1. A circuit, comprising:
    an output of a first inverter directly connected to a first charge storage node, to a first source/drain of a first FET and through a second resistor to an input of a second inverter;
    an output of said second inverter directly connected to a second charge storage node, to a first source/drain of a second FET and through a first resistor to an input of said first inverter;
    a second source/drain of said first FET connected to a first bit line and a second source/drain of said second FET connected to a second bit line;
    gates of said first and second FETs connected to a wordline;
    said first and second resistors independently comprising a material having an amorphous state and a crystalline state, said amorphous state having a higher resistance than said crystalline state, said material reversibly convertible between said amorphous state and said crystalline state by application of heat; and
    means for applying sufficient heat to said first and second resistors to (i) change said amorphous state of said first and second resistors to said crystalline state and to (ii) change said crystalline state of said first and second resistors to said amorphous state.

2. The circuit of claim 1, wherein said means for applying sufficient heat to said first and second resistors comprises a resistive heating element proximate to said first and second resistors and electrically isolated from said first and second resistors.

3. The circuit of claim 1, wherein said material is a chalcogenide.

4. The circuit of claim 1, wherein said material contains germanium or antimony.

5. The circuit of claim 1, further including:
    a first capacitor connected between said first resistor and said second storage node; and
    a second capacitor connected between said second resistor and said first storage node.

6. The circuit of claim 1, further including:
    a radiation detector connected to a heater control circuit, said heater control circuit connected to said means for heating.

7. The circuit of claim 1, wherein said means for applying sufficient heat to said resistor comprises a high current supply switchably connected across opposite sides of said resistor.

8. The circuit of claim 1, wherein said means for applying sufficient heat to said first and second resistors comprises a resistive heating element proximate to and electrically isolated from said first and second resistors.

9. A method of autonomic protection of an electronic device from soft error upset, comprising:
    providing a circuit comprising:
        a charge storage node connected to a resistor, said resistor comprising a material having an amorphous state and a crystalline state, said amorphous state having a higher resistance than said crystalline state, said material reversibly convertible between said amorphous state and said crystalline state by application of heat;
        means for applying sufficient heat to said resistor to (i) change said amorphous state of said resistor to said crystalline state and to (ii) change said crystalline state of said resistor to said amorphous state;
        means for writing data to said charge storage node and means for reading data from said charge storage node; and
        a radiation detector; and
    either (i) upon said radiation detector detecting radiation, increasing the resistance of said resistor by changing a physical state of said resistor from said crystalline state to an amorphous state and after a preset duration of time has passed without said radiation detector detecting radiation or detecting less than a preset number of radiation events in said preset duration of time, decreasing the resistance of said resistor by changing said resistor from said amorphous state to said crystalline state or (ii) upon said radiation detector detecting radiation, decreasing the resistance of said resistor by changing said physical state of said resistor from said amorphous state to said crystalline state and after said preset duration of time has passed without said radiation detector detecting radiation or detecting less than a preset number of radiation events in said preset duration of time, increasing the resistance of said resistor by changing said resistor from said crystalline state to said amorphous state.

10. The method of claim, 9, wherein said circuit operates at a faster rate when said resistor is in said crystalline state than when said resistor is in said amorphous state.

11. The method of claim, 9, wherein said circuit operates at a faster rate when said resistor is in said amorphous state than when said resistor is in said crystalline state.

12. The method of claim 9, wherein said radiation detector comprises an SRAM array having an electronic error correction circuit and the method further includes monitoring soft-error upset rates in the SRAM array.

13. The method of claim 9, wherein said charge storage node is a portion of a static random access memory cell, a single port static random access memory cell, a multi-port static random access memory cell, a dynamic random access memory cell, a register, a latch or a flip-flop.

14. The method of claim 9, wherein said means for applying sufficient heat to said resistor comprises means for applying a sufficiently high current across said resistor to heat said resistor, when said current is ramped up and down at first rates said physical state of said resistor changing from said crystalline state to said amorphous state and when said current is ramped up and down at second rates, said physical state of said resistor changing from said amorphous state to said crystalline state.

15. The method of claim 9, wherein said means for applying sufficient heat to said resistor comprises a resistive heating element proximate to and electrically isolated from said resistor and (i) said changing said physical state of said resistor from said crystalline state to said amorphous state includes applying and de-applying power to said resistive heating element at first rates and (ii) said changing the physical state of said resistor from said amorphous state to said crystalline state includes applying and de-applying power to said resistive heating element at second rates.

16. The method of claim 9, wherein said charge storage node is a portion of a multi-port static random access memory cell or a dynamic random access memory cell.

17. A structure, comprising:

a substrate;

at least three dielectric layers stacked from a first dielectric closest to said substrate and a last dielectric layer furthest from said substrate;

a charge storage node formed in said substrate, said charge storage node connected to a resistor formed in one of said at least three dielectric layers, said resistor comprising a material having an amorphous state and a crystalline state, said amorphous state having a higher resistance than said crystalline state, said material reversibly convertible between said amorphous state and said crystalline state by application of heat; and means for applying sufficient heat to said resistor to (i) change said amorphous state of said resistor to said crystalline state and to (ii) change said crystalline state of said resistor to said amorphous state.

18. The structure of claim 17, wherein said charge storage node is a source/drain of a first field effect transistor and said resistor is connected between said source/drain of said first field effect transistor and a gate of a second field effect transistor.

19. The structure of claim 18, wherein said resistor comprises a layer of said material in a contact in said first dielectric layer, said contact abutting said source/drain of said first field effect transistor and a wire in a second dielectric layer of said three or more dielectric layers, said wire connected to said gate of said second transistor.

20. The structure of claim 18, wherein said resistor comprises a layer of said material in a wire in a second dielectric layer of said at least three dielectric layers, said wire contacting a contact in said first dielectric layer, said contact contacting said source/drain of said first field effect transistor, said wire connected to said gate of said second transistor.

21. The structure of claim 17, wherein said means for applying sufficient heat to said resistor comprises:

a resistive heating element proximate to and electrically isolated from said resistor; and wherein said resistive heating element is located in a third dielectric layer of said at least three dielectric layers and aligned over said resistor, said second dielectric layer between said first and third dielectric layers.

22. The structure of claim 17, wherein said means for applying sufficient heat to said resistor comprises a high current power supply switchably connected across opposite sides of said resistor.

23. The structure of claim 17, wherein said means for applying sufficient heat to said resistor comprises:

a resistive heating element proximate to and electrically isolated from said resistor; and wherein said resistive heating element is located in said substrate and aligned under said resistor.

24. The structure of claim 17, wherein said means for applying sufficient heat to said resistor comprises:

a resistive heating element proximate to and electrically isolated from said resistor; and wherein said resistive heating element is located in said first dielectric layer and partially surrounding said resistor.

25. The structure of claim 17, wherein said means for applying sufficient heat to said resistor comprises:

a resistive heating element proximate to and electrically isolated from said resistor; and wherein said resistive heating element comprises a layer in said contact.

* * * * *